United States Patent [19]

Jun

[11] Patent Number: 4,855,628

[45] Date of Patent: Aug. 8, 1989

[54] SENSE AMPLIFIER FOR HIGH PERFORMANCE DRAM

[75] Inventor: Dong-Soo Jun, Taegu, Rep. of Korea

[73] Assignee: Samsung Semiconductors and Telecommunications Co., Ltd., Gumi, Rep. of Korea

[21] Appl. No.: 120,985

[22] Filed: Nov. 16, 1987

[30] Foreign Application Priority Data

Nov. 21, 1986 [KR] Rep. of Korea .................... 86-9864

[51] Int. Cl.[4] .................. G01R 19/00; G11C 7/00; H03K 3/023; H03K 3/353
[52] U.S. Cl. .................. 307/530; 307/279; 307/578; 365/208; 365/196; 365/154
[58] Field of Search ............ 307/530, 279, 355, 475, 307/269, 601, 602, 603, 605, 362, 594, 596, 597, 578; 365/189, 191, 195, 196, 203, 205, 207, 208, 154, 233

[56] References Cited

U.S. PATENT DOCUMENTS

| 4,694,205 | 9/1987 | Shu et al. | 307/530 |
| 4,743,784 | 5/1988 | Obara et al. | 307/530 |
| 4,748,349 | 5/1988 | McAlexander III et al. | 307/530 |

Primary Examiner—Stanley D. Miller
Assistant Examiner—David R. Bertelson
Attorney, Agent, or Firm—Ladas & Parry

[57] ABSTRACT

A sense amplifier and high performance DRAM, in combination, has in the DRAM at least one row of memory cells, whereby the memory cells of the row may be arranged in respective columns with memory cells of other rows. Each of the memory cells has a transistor and a capacitor connected serially between one of bit lines successively along the row and a fixed voltage source. Word lines are respectively connected to gates of the transistors of the memory cells for activating the memory cell selectively according to row address. The sense amplifier has a cross-coupled bistable flip-flop connecting the bit lines to each other in the row. A latch transistor connected to the flip-flop detects and amplifies a voltage difference between the bit lines. The bit lines are equalized and precharged with a reference voltage in response to a clock control signal. A cross-coupled pair of transistors also connecting the bit lines to each other transfer a charging voltage to the bit lines. A power-supply level voltage is supplied under the control of first and second control clock signals and boosted to a higher level charging voltage under the control of a third control clock signal, whereby the storage capacitors of the memory cells are charged to the higher voltage.

2 Claims, 2 Drawing Sheets

SENSE AMPLIFIER FOR HIGH PERFORMANCE DRAM

BACKGROUND OF THE INVENTION

This invention relates to a sense amplifier for a CMOS DRAM (Dynamic Random Access Memory) and, more particularly, to the high performance sense amplifier that can read and write the data on a DRAM storage cell.

A power supply voltage Vcc for a logic level 1 or an earth level voltage Vss for a logic level 0 is stored on a typical DRAM memory cell. But when the DRAM has a higher density, the dimensions of a memory cell and storage capacitor for this are reduced sufficiently to become susceptible to a refresh time or soft error. The data stored in the memory cell may then be destroyed due to leakage current of the memory cell itself and refresh operation (time) suitable for the user may not be obtained.

Moreover, although soft error of the logic 1 voltage of the memory cell due to α-particles can be alleviated with a high-capacitance storage capacitor of trench structure, DRAM fabrication with an epitaxial layer, oxide layer or oxynitride layer to increase the capacitance of the storage capacitor presents many difficulties because of the complexities of fabrication process these require.

It is, therefore, an objection of this invention to provide a sense amplifier that can store a charge of voltage on the storage capacitor of a DRAM memory cell high enough to alleviate α-particle soft error in the DRAM.

DETAILED DESCRIPTION OF THE INVENTION

From now on this invention will be explained in detail with reference to Figures.

Figure 1:
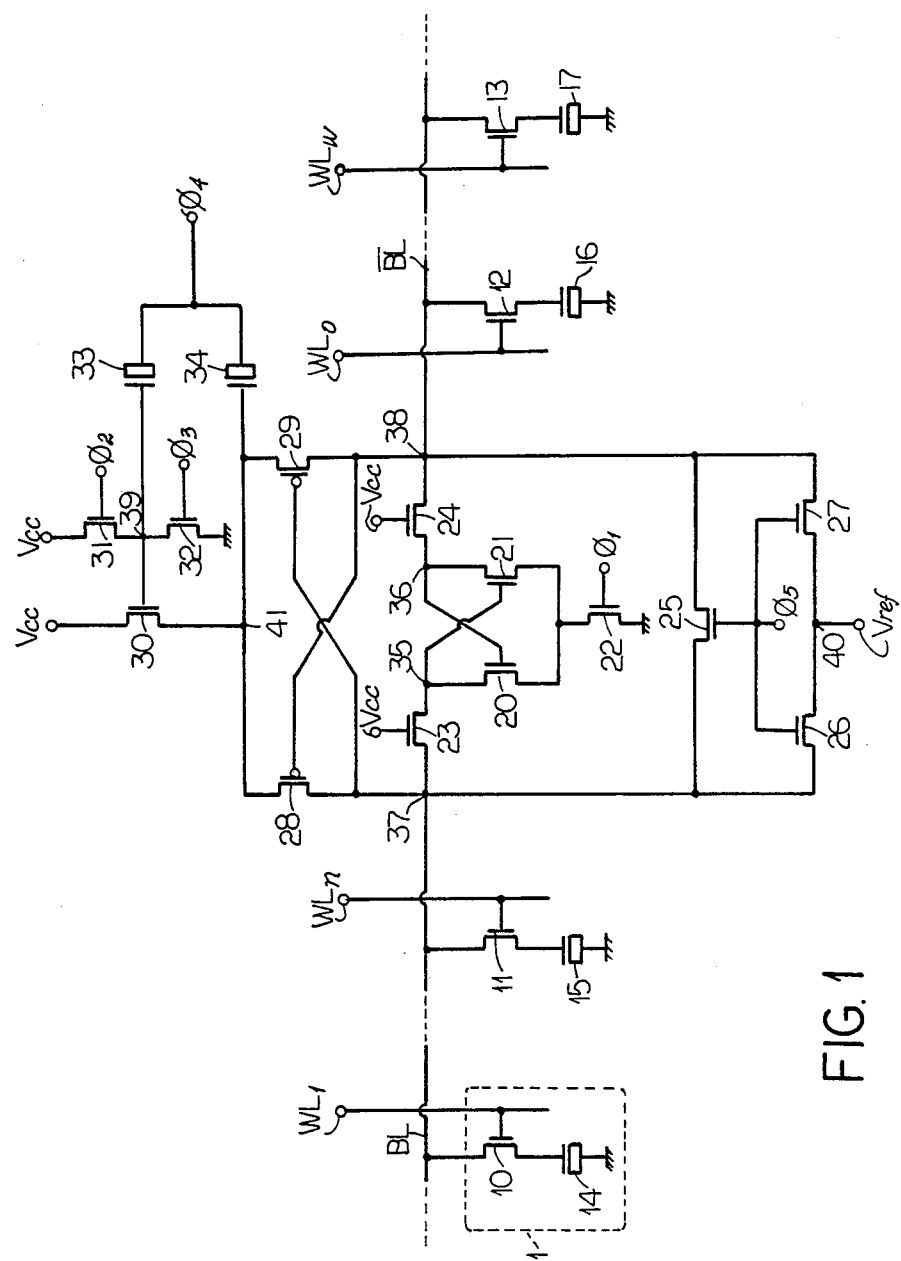
FIG. 1 shows the circuit diagram of sense amplifier according to this invention for a CMOS DRAM, together with DRAM components with which it is used such as a memory cell.

FIG. 1 is the circuit diagram of the sense amplifier and memory cell according to this invention.

When the control clock $\phi_1$ goes to a high state, the NMOS connected serially with the node of the higher voltage between node points 35 and 36 goes to OFF state readily, and the NMOS connected serially with the node of the lower voltage keeps its ON state to make the voltage difference between node points 35 and 36 very large and the sensing operation possible.

Memory cell is composed of one NMOS transistor 10 and one storage capacitor 14 which are connected serially between a bit line (or row line) and a fixed voltage source (ground or power supply voltage Vcc). Like the conventional array, several memory cells are connected with polysilicon bit line BL and $\overline{BL}$ which are shorted with node points 37 and 38 of sense amplifier located at the center, respectively. In addition, polysilicon or metal word line $WL_1$-$WL_n$ and $WL_o$ - $WL_w$ are connected with the gates of pass transistors 10-13 of the above memory cells to activate the memory cell selectively according to row address.

On the other hand, the sense amplifier has a bistable flip-flop composed of cross-coupled NMOS transistors 20, 21 of which sources are connected in common with the drain of latch NMOS transistor 22. The source of NMOS transistor 22 is grounded, and control pulse $\phi_1$ is applied on the gate.

On the other hand, node points 35 and 36 of the above bistable flip-flop are connected with the polysilicon bit line BL and $\overline{BL}$ at node points 37 and 38 through pass NMOS transistors 23 and 24, respectively. Power supply voltage Vcc is applied on the gates of above NMOS transistors 23 and 24.

It should be noted that FIG. 1 is the 1-transistor cells connected to one sense amplifier of the semiconductor CMOS DRAM system.

In addition, NMOS transistor 25 is shunted between nodes 37 and 36 for the equalization of bit line BL and $\overline{BL}$. Also two pass transistors 26 and 27 connected serially are shunted between node points 37 and 38. Clock pulse $\phi_5$ is applied on the gates of above equalization transistor 25 and two pass transistors 26 and 27. In addition, the connection junction of the pass transistors 26 and 27 is connected with the reference voltage $V_{REF}$. Therefore, when the above control pulse $\phi_5$ goes to the high state both of the bit lines BL and $\overline{BL}$ are charged with $V_{REF}$ voltage equally.

In addition, a pair of PMOS transistors 28 and 29 of which drain and gate are cross-coupled to those of each other are placed between above node points 37 and 38, and the drains of the both PMOS transistors are connected with node point 41 in common.

Therefore, when the bistable flip-flop which is composed of NMOS transistors 20 and 21 and latch transistor 22 finishes its sensing operation, PMOS transistor 28 or 29 which is connected with the lower state node between node 37 and 38 goes to OFF state, and the bit line which is connected with the higher state node point is charged to high voltage as will be explained in detail.

On the other hand, the drain and source of the load PMOS transistor 30 are connected with node point 41 and power supply voltage Vcc, respectively. In addition, the gate of the above PMOS transistor 30 is connected with the drain of NMOS transistors 32 and source of NMOS transistor 31. These NMOS transistors are the useful means for the restore control of the above bit line.

One the other hand, power supply voltage Vcc and control clock $\phi_2$ are applied on the drain and gate of the above NMOS transistor 31. Also, the source and gate of the above NMOS transistor 32 are connected with ground and control clock $\phi_3$, respectively.

In addition, gated capacitors 33 and 34 are connected with the above node points 39 and 41, respectively. Control clock $\phi_4$ is applied on both of the above capacitors 33 and 34.

During precharge cycle, the above clock $\phi_4$ is applied before the word line goes to the low state. This clock voltage is propagated through the gated capacitors 33 and 34 to node points 39 and 41 to make PMOS transistor 30 go to OFF state. The voltage level of node point 41 is stored along the bit line on the storage capacitor of memory cell selected by the addressed word line.

Figure 2:
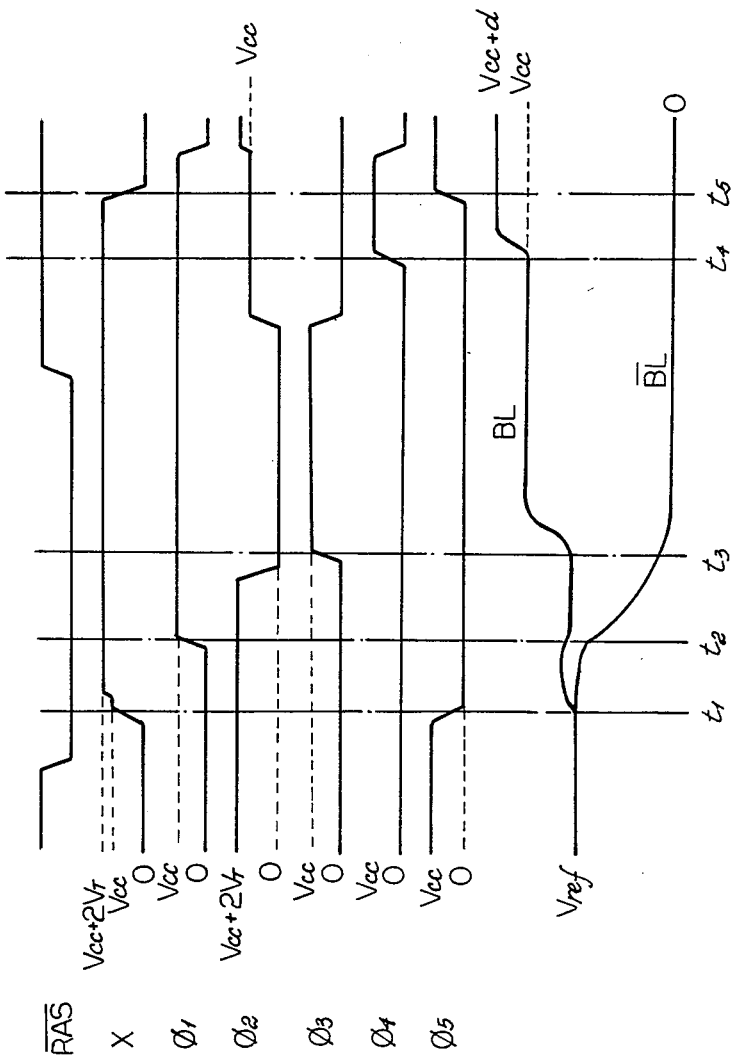
FIG. 2 shows the operation timing diagram of the circuit of FIG. 1.

On the other hand, FIG. 2 shows the operation timing diagram of the circuit of FIG. 1 according to this invention. From now on, the operation mechanism of the circuit of FIG. 1 is explained with FIG. 2 in detail.

It is easily understood to the persons skilled in the art that row address signal x comes from the well known row address decoder which is not drawn, after the row address strobe signal $\overline{RAS}$ goes to a low state in the conventional DRAM.

The row selection address signal x provides signal of $Vcc+2V_T$ voltage from the well known row address decoder. The reference voltage $V_{REF}$ applied on the node point 40 may by equal to $\frac{1}{2}Vcc$ or $Vcc-V_T$. From now on, it is assumed that $V_{REF}$ is equal to $\frac{1}{2}Vcc$ for the explanation. When the row selection address signal x goes to the high state and the control clock $\phi_5$ is the high state (Vcc voltage level) before the latch control clock $\phi_1$ goes to the high state, all NMOS transistors 25, 26 and 27 go to the ON state. Therefore, the reference voltage $V_{REF}$ applied on node point 40 precharges the bit line BL and $\overline{BL}$ up to the $V_{REF}$ volt through the above NMOS pass transistors 26 and 27. Both of the bit lines BL and $\overline{BL}$ are made to be equal to $V_{REF}$ voltage level by the above NMOS transistor 25.

For the convenience of explanation, it is assumed that $Vcc+\alpha$ voltage level is stored on the storage capacitor 14 of the memory cell 1 of FIG. 1. $\alpha$ is a voltage larger than $2V_T$ volt as will be explained.

If the above control clock $\phi_5$ goes to low state (earth level) and row selection address signal x is applied on word line $WL_1$ at time $t_1$ of FIG. 2, the NMOS pass transistor 10 turns on so that there exists the voltage level difference between bit lines BL and $\overline{BL}$ due to the stored voltage on the above storage capacitor 14. This voltage difference propagates to nodes 35 and 36 through pass transistor 23 and 24, respectively, and is equal to about 50–2000 mV because the parasitic capacitance of bit line is far larger than the capacitance of the above storage capacitor 14.

And then, when the latch control clock $\phi_1$ goes to the high state at time $t_2$, latch transistor 22 turns on. Since the voltage level of the above node 35 is higher than that of node 36, NMOS transistor 21 turns on while the NMOS transistor 20 goes to OFF state. Consequently, the voltage of node 36 lowers to the ground level losing its charge through the above transistor 21 and 22, and large voltage difference between node 35 and 36 is developed.

Therefore, the voltages of above nodes 35 and 36 are transferred to nodes 37 and 38 through pass transistors 23 and 24, respectively so that PMOS transistor 28 turns on and PMOS transistor 29 turns off.

In addition, as control clock $\phi_2$ is changed from the high state ($Vcc+2V_T$ voltage level) to the low state (ground level) NMOS transistor 31 turns off and as at time $t_3$ the control clock $\phi_3$ goes to the high state (Vcc level), node 39 at voltage level of Vcc is connected to the ground by the conduction of NMOS transistor 32.

Therefore, as the PMOS transistors 30 and 28 are in their ON states, bit line BL is restored to the power supply voltage level Vcc.

After the bit lines BL and $\overline{BL}$ are charged to power supply voltage Vcc and 0 volt, respectively, the above control clock $\phi_2$ goes to the high state (Vcc voltage level) and at the same time control clock $\phi_3$ goes to the low state (ground level) so that node point 39 is charged to $Vcc-V_T$ voltage level, and PMOS transistor 30 turns off.

Next, before the row selection address signal x goes to the low state, the voltage level of nodes 39 and 41 are charged up to high voltage through gated capacitors 33 and 34 because the control clock of $\phi_4$ goes to the high state (Vcc voltage level).

Therefore, although the voltage level of node 41 is boosted by $\alpha$ where $\alpha$ is larger than $2V_T$ volt, the PMOS transistor 30 keeps its OFF state and $Vcc+\alpha$ volt is stored on the storage capacitor 14 along the PMOS transistor 28, bit line BL and NMOS transistor 10 of the memory cell 1.

By taking $Vcc+2V_T$ as its high state the row selection address signal x which is applied on word line WL can store enough charge on the above storage capacitor 14.

Next, as the row selection address signal x and control clock $\phi_5$, are in their low state and high state, respectively at time $t_5$, the bit lines BL and $\overline{BL}$ are equalized to the reference voltage $V_{REF}$. The voltage level of node 39 is kept at Vcc level with control clock $\phi_1$ and $\phi_4$ in low state and control clock $\phi_2$ at $Vcc+2V_T$ level.

As explained before, in this invention, voltage level larger than the power supply voltage can be stored on one transistor memory cell so that soft error which comes from the leakage of the stored charge of storage capacitor due to the electron-hole generation by $\alpha$-particle penetration can be avoided.

The invention is in no way limited to the example described hereinabove. Various modifications of the disclosed embodiment, as well as other embodiments of the invention, will become apparent to persons skilled in the art upon reference to the description of the invention. It is therefore contemplated that the appended claims will cover any such modifications or embodiments as fall within the true scope of the invention.

What is claimed is:

1. A sense amplifier and high performance DRAM, in combination, comprising:
   a DRAM comprising:
   at least one row of memory cells (1), whereby the memory cells of the row may be arranged in respective columns with memory cells of other rows;
   first and second bit lines (BL and $\overline{BL}$) successively along the row axially;
   a fixed voltage source;
   each of the memory cells comprising a transistor (10, 11, 12, 13) and a capacitor (14, 15, 16, 17) connected serially between one of the bit lines and the fixed voltage source; and
   word lines respectively for the memory cells, each word line being connected to a gate of the transfer of one of the memory cells for activating the memory cell selectively according to row address; and
   the sense amplifier comprising:
   a cross-coupled bistable flip-flop (20, 21) connecting the bit lines to each other in the row;
   a latch transistor (22) connected to the flip-flop for detecting and amplifying a voltage difference between the bit lines;
   equalization and precharge means (25, 26, 27, $\phi_5$ and $V_{REF}$) for equalizing and precharging the bit lines with a reference voltage in response to a clock control signal;
   transfer means comprising a cross-coupled pair of transistors (28, 29) also connecting the bit lines to each other for transferring a charging voltage to the bit lines;
   charging means (31, 32, $\phi_2$, $\phi_3$ and Vcc) connected to the transfer means for supplying a power-supply level voltage under the control of first and second control clock signals; and
   boosting means connected to the charging means for boosting the power-supply level voltage of the charging means to a higher level charging voltage under the control of a third control clock signal, whereby the storage capacitors of the memory cells are charged to the higher voltage.

2. The sense amplifier and DRAM according to claim 1, wherein:

the transfer means further comprises a PMOS transistor (30) for transferring the charging voltage from the charging and boosting means to the bit lines;

the charging means further comprises one NMOS transistor (32) shunted between a gate of the PMOS transistor and ground under the control of the second control clock signal applied on a gate of the one NMOS transistor and another NMOS transistor (31) shunted between a terminal for the power-supply level voltage and the gate of the PMOS transistor under the control of the first control clock signal applied on a gate of the other NMOS transistor; and the boosting means comprises means for transferring the third control clock signal to the gate and a drain of the PMOS transistor through a pair of MOS type gaped capacitors (33 and 34), respectively.

* * * * *